(12) United States Patent
Morgan (10) Patent No.: US 9,705,467 B2
(45) Date of Patent: Jul. 11, 2017

(54) SUB-NETWORK ENHANCED REFLECTIONLESS FILTER TOPOLOGY

(71) Applicant: Associated Universities, Inc., Washington, DC (US)

(72) Inventor: Matthew Alexander Morgan, Earlysville, VA (US)

(73) Assignee: Assoicated Universties, Inc., Washington, DC (US)

( * ) Notice: Subject to any disclaimer, the term of this patent is extended or adjusted under 35 U.S.C. 154(b) by 68 days.

(21) Appl. No.: 14/724,976

(22) Filed: May 29, 2015

(65) Prior Publication Data

US 2016/0043701 A1    Feb. 11, 2016

Related U.S. Application Data

(60) Provisional application No. 62/016,715, filed on Jun. 25, 2014, provisional application No. 62/030,171,
(Continued)

(51) Int. Cl.
*H03H 7/38*    (2006.01)
*H03H 7/12*    (2006.01)
(Continued)

(52) U.S. Cl.
CPC ............ *H03H 7/38* (2013.01); *H03H 7/0138* (2013.01); *H03H 7/06* (2013.01); *H03H 7/09* (2013.01);
(Continued)

(58) Field of Classification Search
CPC ...... H01P 1/20; H01P 3/02; H01P 3/08; H01P 5/00–5/107; H01P 1/227;
(Continued)

(56) References Cited

U.S. PATENT DOCUMENTS 3,514,722 A    5/1970   Cappucci et al.
3,605,044 A    9/1971   Seidel et al.
(Continued)

OTHER PUBLICATIONS

Search Report and Written Opinion for PCT App. No. PCT/US15/33118 dated Oct. 8, 2015.
(Continued)

*Primary Examiner* — Dean Takaoka
*Assistant Examiner* — Alan Wong
(74) *Attorney, Agent, or Firm* — Remenick PLLC (57) ABSTRACT

Reflectionless low-pass, high-pass, band-pass, band-stop, all-pass, and all-stop filters, as well as a method for designing such filters is disclosed, along with a method of enhancing the performance of such filters through the use of sub-networks to further modify and improve the frequency response. These filters preferably function by absorbing the stop-band portion of the spectrum rather than reflecting it back to the source, which has significant advantages in many different applications. The sub-networks preferably offer additional degrees of freedom by which the leakage through the parent filter may be cancelled or reinforced to alter cutoff sharpness, stop-rejection, or other measures of performance.

29 Claims, 9 Drawing Sheets

Related U.S. Application Data filed on Jul. 29, 2014, provisional application No. 62/041,965, filed on Aug. 26, 2014, provisional application No. 62/074,142, filed on Nov. 3, 2014.

(51) Int. Cl.
  *H03H 7/09* (2006.01)
  *H03H 7/01* (2006.01)
  *H03H 7/06* (2006.01)
  *H03H 7/48* (2006.01)

(52) U.S. Cl.
  CPC ............ *H03H 7/12* (2013.01); *H03H 7/1708* (2013.01); *H03H 7/1725* (2013.01); *H03H 7/48* (2013.01)

(58) Field of Classification Search
  CPC ............. H03H 2007/013; H03H 11/10; H03H 7/0115; H03H 7/0161; H03H 7/12; H03H 7/38
  USPC .................................................. 333/167, 202
  IPC ....................................................... H01P 1/227
  See application file for complete search history.

(56) References Cited

U.S. PATENT DOCUMENTS

| | | | |
|---|---|---|---|
| 3,748,601 | A | 7/1973 | Seidel |
| 3,869,585 | A | 3/1975 | Snyder |
| 7,323,955 | B2 * | 1/2008 | Jachowski ............ H01P 1/2039 327/556 |
| 8,392,495 | B2 * | 3/2013 | Morgan .................. H03H 7/38 708/819 |
| 2007/0152750 | A1 | 7/2007 | Andersen et al. |
| 2008/0297284 | A1 | 12/2008 | Ishii et al. |
| 2010/0205233 | A1 | 8/2010 | Morgan |
| 2012/0023059 | A1 | 1/2012 | Morgan et al. |
| 2013/0257561 | A1 | 10/2013 | Gorostegui |

OTHER PUBLICATIONS

Morgan, M. et al. Reflectionless Filter Structures. Jul. 29, 2014.
Morgan, M. Enhancement of Reflectionless Filters Using Stop-Band Sub-Networks. Jul. 2014.

\* cited by examiner

Fig. 1. Example of a low-pass reflectionless filter, known in the prior art.

5   Fig. 2. The circuit in Fig. 1, redrawn to emphasize the location and internal ports of the sub-network terminating the primary stop-band signal path. PRIOR ART.

Fig. 3. PRIOR ART

Fig. 4. Example topology (inset) and simulated performance of a low-pass reflectionless filter with attenuator sub-network (solid line) compared to that of a reflectionless filter of the prior art (dashed line). Cancellation of the stop-band leakage has resulted in improved stop-band rejection. PRIOR ART Fig. 5. Example topology (inset) and simulated performance of a low-pass reflectionless filter with another reflectionless filter as sub-network, where the sub-network filter contains an attenuator as its sub-network (solid line). The first-order reflectionless filter of the prior art is shown for comparison (dashed line). Constructive interference with transition-band leakage has improved the sharpness of the transition corner.

SUB-NETWORK ENHANCED REFLECTIONLESS FILTER TOPOLOGY

REFERENCE TO RELATED APPLICATIONS

This application claims priority to U.S. Provisional Application Nos. 62/016,715, filed Jun. 25, 2014, 62/030171, filed Jul. 29, 2014, 62/041,965, filed Aug. 26, 2014, and 62/074, 142, filed Nov. 3, 2014, all of which are entitled "Sub-Network Enhanced Reflectionless Filter Topology," and are hereby specifically and entirely incorporated by reference.

RIGHTS IN THE INVENTION

This invention was made with government support under Cooperative Agreement AST-0223851, between the National Science Foundation and Associated Universities, Inc., and, accordingly, the United States government has certain rights in this invention.

BACKGROUND

1. Field

The invention is directed toward electronic filters and methods of their use. Specifically, the invention is directed toward reflectionless electronic filters and methods of their use.

2. Background

Figure 1:
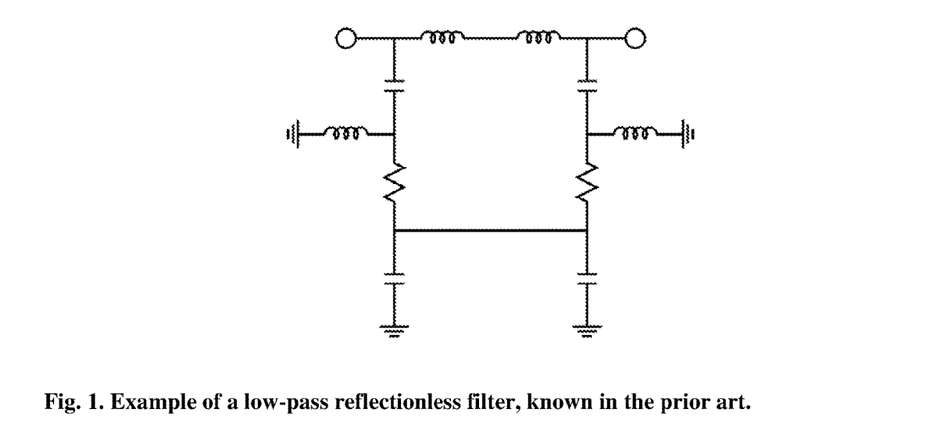
FIG. 1 is an example of a low-pass reflectionless filter, known in the prior art.

Virtually all electronic systems use some kind of filtering to reject unwanted frequency components. In most conventional filters, the rejected signals are bounced back to the source, eventually dissipating in the generator itself, or in the interconnecting wires/transmission lines, or by being radiated into the instrument housing. This manner of rejecting unwanted signals can sometimes lead to harmful interactions with other components in the system, either by spurious mixing in non-linear devices, unintentional re-biasing of sensitive active components, or cross-talk between various signal paths. A solution was sought for a filter that would absorb these unwanted signals before they could compromise performance. This led to a novel absorptive filter topology, which is described in U.S. Pat. No. 8,392,495 to Morgan, the entirety of which is incorporated by reference herein. FIG. 1 depicts an example of a low-pass reflectionless filter of the prior art. The absorptive filter solved many problems encountered with conventional filters, such as the sensitivity of mixers to poor out-of-band terminations, detrimental and difficult-to-predict non-linear effects from reactive harmonic loading, leakage or cross-talk due to trapped energy between the filter and other poorly-matched components, and numerous other problems associated with out-of-band impedance matching. It also realized superior performance and manufacturability when compared to other approaches to absorptive filters, such as terminated diplexers and directional filter structures employing quadrature hybrids.

Despite these benefits, however, some applications require a sharper cutoff response than the previously demonstrated reflectionless filters can provide. Recent efforts to address this issue have yielded an enhanced version of the structure which can have a much sharper cutoff response and thus yield greater selectivity in those applications where it is required, while maintaining all the benefits of the original reflectionless filter topology.

SUMMARY

The present invention addresses several of the problems and disadvantages associated with conventional filters, and with the prior art of reflectionless filters, thereby providing a new resource for band selection and definition in electronic systems.

An embodiment of the invention is directed to a reflectionless electronic filter. The filter comprises a symmetric two-port circuit, wherein the symmetry defines an even-mode equivalent circuit and an odd-mode equivalent circuit when the ports are driven in-phase and 180° out-of-phase, respectively; at least one lossless element and at least one matched internal sub-network arranged within the symmetric two-port circuit such that: a normalized input impedance of the even-mode equivalent circuit is substantially equal to a normalized input admittance of the odd-mode equivalent circuit and a normalized input impedance of the odd-mode equivalent circuit is substantially equal to a normalized input admittance of the even-mode equivalent circuit. In this way, the even- and odd-mode equivalent circuits are said to be duals of each other. Each matched internal sub-network provides a matched termination to the stop-band signal path of the reflectionless electronic filter.

Preferably, each sub-network is either symmetric or not symmetric. Reflectionless filter preferably further comprises a leakage path that passes a portion of the stop-band signal from input to output without going through a sub-network and each sub-network is adapted to pass the stop-band signal with an amplitude and phase that partially cancels the amplitude and phase of a portion of the stop-band signal that passes through the leakage path.

In a preferred embodiment, each sub-network is one of an attenuator, a thru-connection, a delay line, and reflectionless filter. Preferably, a sub-network contains at least one additional sub-network. Preferably, a sub-network comprises a cascade of sub-networks. In a preferred embodiment, each sub-network is one of low-pass, high-pass, band-pass, band-stop, all-pass, and all-stop. Each sub-network is preferably active or passive. Each sub-network is preferably tunable.

A first sub-network preferably comprises a reflectionless filter that contains a second sub-network, and the total number of reflectionless filters nested provides the filter order. Preferably, the sub-network filters are tuned to the same or a different frequency as the reflectionless filter. Preferably, the filter is third-order. In a preferred embodiment, the third-order filter is an anti-aliasing filter. Preferably, the filter is implemented as one of a Monolithic Microwave Integrated Circuit, a thin-film printed circuit, a thick-film printed circuit, a Low-Temperature Co-fired Ceramic (LTCC) printed circuit, and an integrated circuit. Preferably, each essentially lossless element is one or more of inductors, capacitors, transmission lines, and waveguides. Each sub-network is preferably implemented using the same or a different technology as the reflectionless filter.

In another embodiment, the reflectionless filter may be obtained by constructing the dual of a previous reflectionless filter. When the filter consists of lumped elements, the dual is obtained by replacing all series connections with shunt connections, the shunt connections with series connections, inductors with capacitors, and capacitors with inductors. Preferably, the resultant dual network is topologically distinct from the original, but remains reflectionless and has the identical frequency response. The dual may also be constructed by exchanging the internal sub-network ports with the external ports.

In a preferred embodiment, higher-order filters are constructed by nesting reflectionless filters alternately with their duals, resulting in the effective cancellation of some elements (by subsequent serial and parallel connection of identical elements). The resulting network preferably has fewer elements than those obtained by nesting identical reflectionless filters, but exhibiting the same performance.

It was previously taught (Morgan, U.S. Pat. No. 8,392, 495) that reflectionless filters may be altered by adding dual elements between circuit nodes in such a way that preserves the symmetry and allows the duality constraints to be met which are required for reflectionless performance. When combined with the above sub-network enhancements these additional elements may be used to positive effect. In a preferred embodiment, the reflectionless filter is second order, wherein one of the two nested filters has been modified with at least one additional inductor and one additional capacitor. Preferably, the added inductor has approximately one-ninth the inductance as the rest of the inductors in the filter, and the added capacitor has approximately one-ninth the capacitance of the rest of the capacitors. Preferably, this modified second-order filter has sharper cutoff response and deeper, extended stop-band rejection.

In another embodiment, reflectionless filters may be cascaded with one or more additional reflectionless filters that are of similar or different design (e.g. low-pass, high-pass, band-pass, band-stop, all-pass, all-stop, or multi-band). The cascaded filters may also be tuned to the same or a different frequency. Referring to the individual cascaded reflectionless filters as "cells," one may cross-connect the sub-network ports of two or more cells with an inter-cell sub-network. The inter-cell sub-network may connect adjacent cells or non-adjacent cells in the cascade. Other embodiments and advantages of the invention are set forth in part in the description, which follows, and in part, may be obvious from this description, or may be learned from the practice of the invention.

DESCRIPTION OF THE DRAWINGS

The invention is described in greater detail by way of example only and with reference to the attached drawings, in which.

DETAILED DESCRIPTION

As embodied and broadly described herein, the disclosures herein provide detailed embodiments of the invention. However, the disclosed embodiments are merely exemplary of the invention that can be embodied in various and alternative forms. Therefore, there is no intent that specific structural and functional details should be limiting, but rather the intention is that they provide a basis for the claims and as a representative basis for teaching one skilled in the art to variously employ the present invention.

A problem in the art capable of being solved by the embodiments of the present invention is a circuit topology and design technique for electronic filters that are well-matched at all frequencies. It has been surprisingly discovered that such filters have a number of unexpected advantages, including minimal reflections on their input and output ports, either in their pass bands or stop bands, or the transition bands. The return loss for these filters is substantially infinite at all frequencies. In conventional filters, on the other hand, stop band rejection is achieved by reflecting the unwanted portion of the spectrum back toward the signal source rather than absorbing it. The instant filters are comprised of lumped element resistors, inductors, and capacitors, or of transmission line equivalents, and combinations thereof and can be implemented in whatever form is suited to the application (e.g. waveguide, coaxial, wire-leaded, surface-mount, monolithically-integrated).

Figure 3:
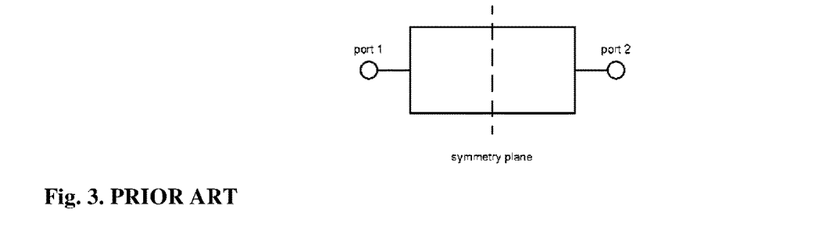
FIG. 3 is a block diagram of a symmetric two-port network.

FIG. 3 depicts an arbitrary, symmetric, two-port network. While symmetry is not required of reflectionless filters, the preferred embodiment is symmetrical. In such a network, if both ports are excited simultaneously with equal signal amplitudes and matching phase, there will be no currents crossing from one side of the symmetry plane to the other. This is called the even-mode. Similarly, if the two ports are excited with equal amplitudes but 180° out of phase, then all nodes that lie on the symmetry plane should have zero electric potential with respect to ground. This is called the odd-mode.

Therefore, it is possible to have two single-port networks, each containing one half of the elements of the original two-port network, where the nodes that lie on the symmetry plane are either open-circuited or shorted to ground. These can be called the even-mode equivalent circuit and the odd-mode equivalent circuit, respectively. Equivalent circuits are circuits that retain all of the electrical characteristics of the original (and often more complex) circuits. The scattering parameters of the original two-port network are then given as the superposition of the reflection coefficients of the even- and odd-mode equivalent circuits, as follows:

$$s_{11} = s_{22} = \frac{1}{2}(\Gamma_{even} + \Gamma_{odd}) \quad (1)$$

$$s_{21} = s_{12} = \frac{1}{2}(\Gamma_{even} - \Gamma_{odd}) \quad (2)$$

wherein $s_{ij}$ is the scattering coefficient from port j to port i, and $\Gamma_{even}$ and $\Gamma_{odd}$ are the reflection coefficients of the even- and odd-mode equivalent circuits, respectively. Thus, the condition for perfect input match, $s_{11}=0$, is derived from (1) as follows:

$$\Gamma_{even} = -\Gamma_{odd} \quad (3)$$

This is equivalent to saying that the normalized even-mode input impedance is equal to the normalized odd-mode input admittance (or vice-versa):

$$z_{even} = y_{odd} \quad (4)$$

wherein $z_{even}$ is the normalized even-mode impedance, and $y_{odd}$ is the normalized odd-mode admittance, which is satisfied if the even- and odd-mode circuits are duals of each other (e.g. inductors are replaced with capacitors, shunt connections with series connections). Further, by combining (2) and (3), the transfer function of the original two-port network is given directly by the even-mode reflection coefficient:

$$s_{21} = \Gamma_{even} \quad (5)$$

Embodiments of the invention are directed to reflectionless filters. The filter can be a symmetric two-port circuit including at least one essentially lossless element, and at least one sub-network which is impedance-matched. This matched sub-network, examples depicted in FIGS. 4 and 5, may provide a termination to the primary stop-band signal path, and may take the place of the lossy elements or termination resistors in the reflectionless filters of the prior art. The symmetric circuit can be bisected along the line of symmetry and modeled using even-mode and odd-mode equivalent circuits when the ports are driven in-phase and 180° out-of-phase, respectively. Furthermore, for a chosen normalizing impedance, the normalized input impedance of the even-mode equivalent circuit can be essentially equal to the normalized input admittance of the odd-mode equivalent circuit.

Although the structure of the reflectionless filter which contains the sub-network may be symmetric, the sub-network itself need not be. So long as the ports of the sub-network are matched, the composite filter will preferably be reflectionless also.

Figure 2:
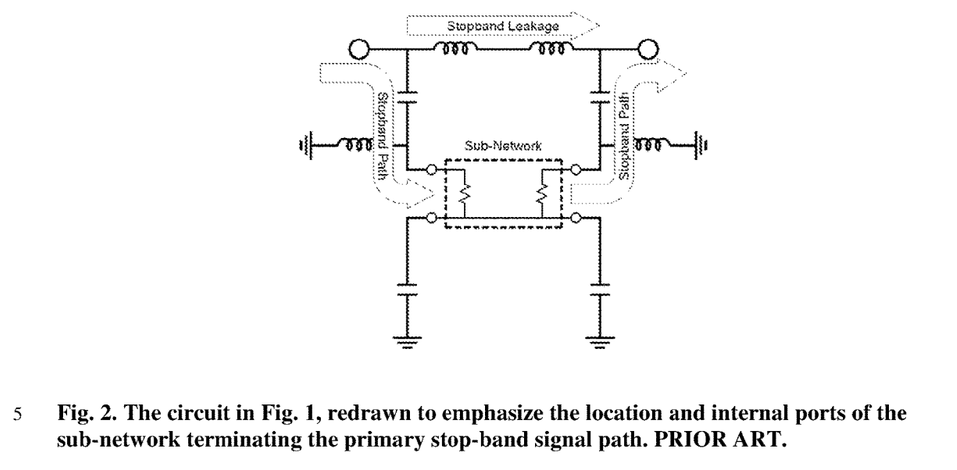
FIG. 2 is the circuit of FIG. 1 redrawn to emphasize the location and internal ports of the sub-network terminating the primary stop-band signal path.
Figure 4:
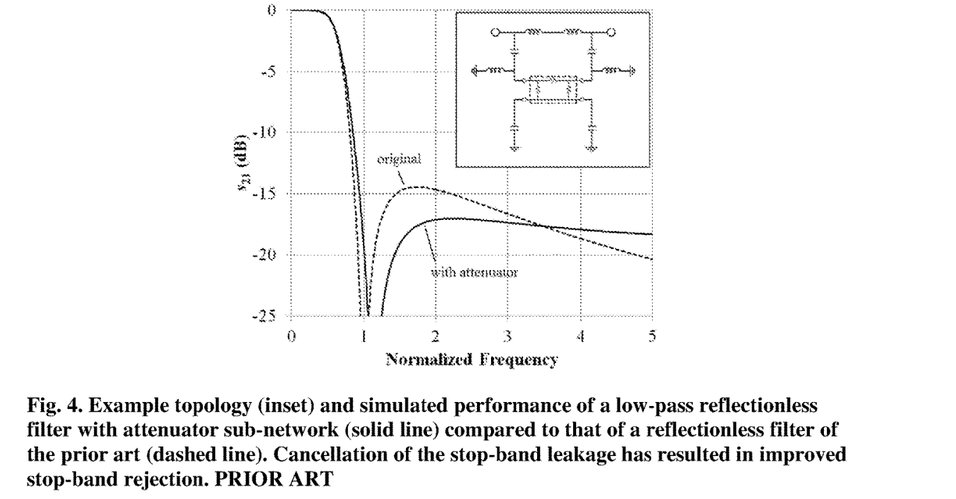
FIG. 4 is an example of the topology (inset) and simulated performance of a low-pass reflectionless filter with attenuator sub-network (solid line) compared to that of a reflectionless filter of the prior art (dashed line). Cancellation of the stop-band leakage has resulted in improved stop-band rejection.

In certain embodiments, for example as shown in FIG. 2, there is a leakage path for a portion of the stop-band signal to pass from the input of the filter to the output, without passing through the sub-network. FIG. 2 depicts the circuit of FIG. 1 redrawn to emphasize the location and internal ports of the sub-network terminating the primary stop-band signal path. The sub-network may then be designed to transfer some of the stop-band energy through the filter with amplitude and phase that cancels with that of the leakage path, either in full or in part, as depicted in FIG. 4. Alternatively, the sub-network may be designed to add constructively with the leakage at the start of the transition band, and destructively further into the stop-band, thereby improving the sharpness of the cutoff response, as shown in FIG. 5.

In certain embodiments, this sub-network may take the form of an attenuator. In other embodiments, the sub-network may be simply a thru-line, or delay-line, thereby achieving an all-pass filter with frequency-selective phase characteristics.

Figure 5:
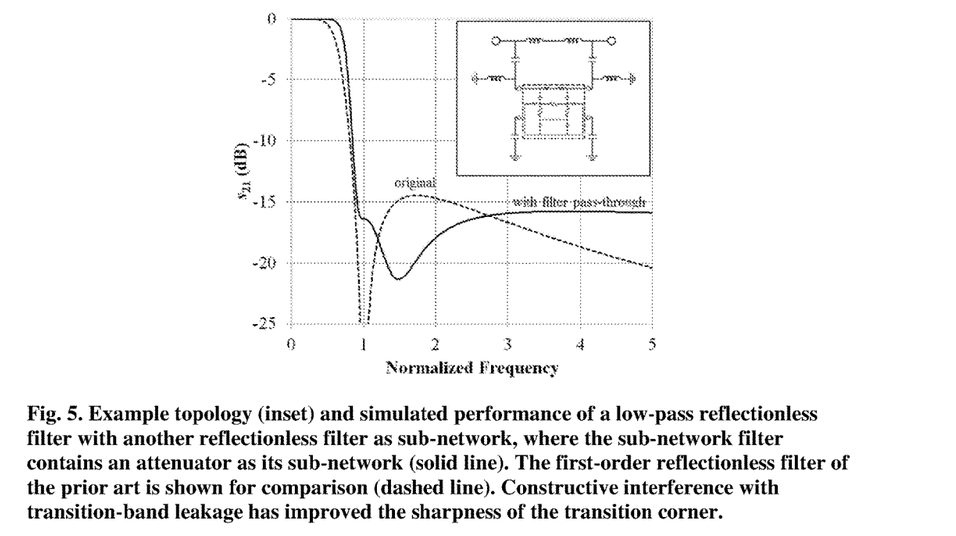
FIG. 5 is an example of the topology (inset) and simulated performance of a low-pass reflectionless filter with another reflectionless filter as sub-network, where the sub-network filter contains an attenuator as its sub-network (solid line). The performance of the first-order reflectionless filter of the prior art is shown for comparison (dashed line). Constructive interference with transition-band leakage has improved the sharpness of the transition corner

In still other embodiments, as shown in FIG. 5, the sub-network itself may be another reflectionless filter. The sub-network reflectionless filter may then contain another sub-network, and so on, where the number of filters nested in this manner may be referred to as the filter order. The sub-network filters may be tuned to the same frequency as the parent filter, or tuned to different frequencies.

Figure 6:
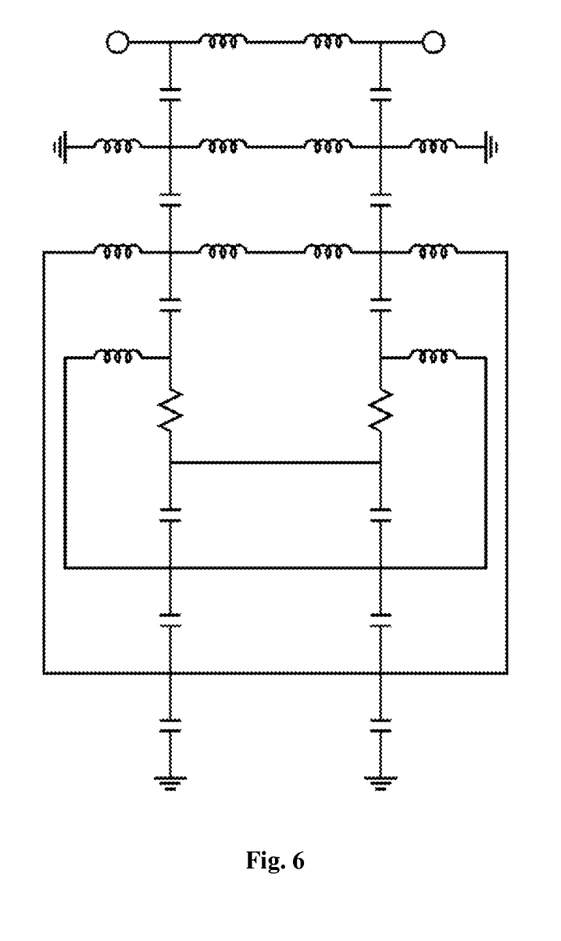
FIG. 6 is an example of a third-order low-pass reflectionless filter topology.
Figure 7:
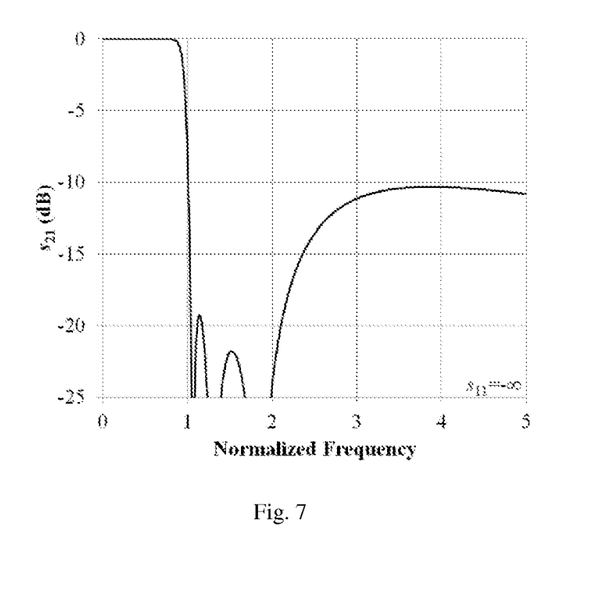
FIG. 7 is the simulated performance of a third-order low-pass reflectionless filter topology.

In a preferred embodiment, as shown in FIG. 6, the filter is low-pass and third-order. The frequency response of this embodiment preferably has a very sharp cutoff and good rejection for the first octave of bandwidth, as shown in FIG. 7, and is therefore very useful as a baseband anti-aliasing filter where rejection of the first Nyquist zone is most critical.

In other embodiments, the reflectionless filter is the dual of another reflectionless filter. In some embodiments, where the reflectionless filter comprises a lumped-element network, the dual is constructed by replacing series connections with parallel connections, parallel connections with serial connections, inductors with capacitors, and capacitors with inductors. In still other embodiments, the dual is obtained by swapping the internal sub-network with the external ports. These two methods for obtaining the dual are illustrated by example in FIG. 8.

Figure 8:
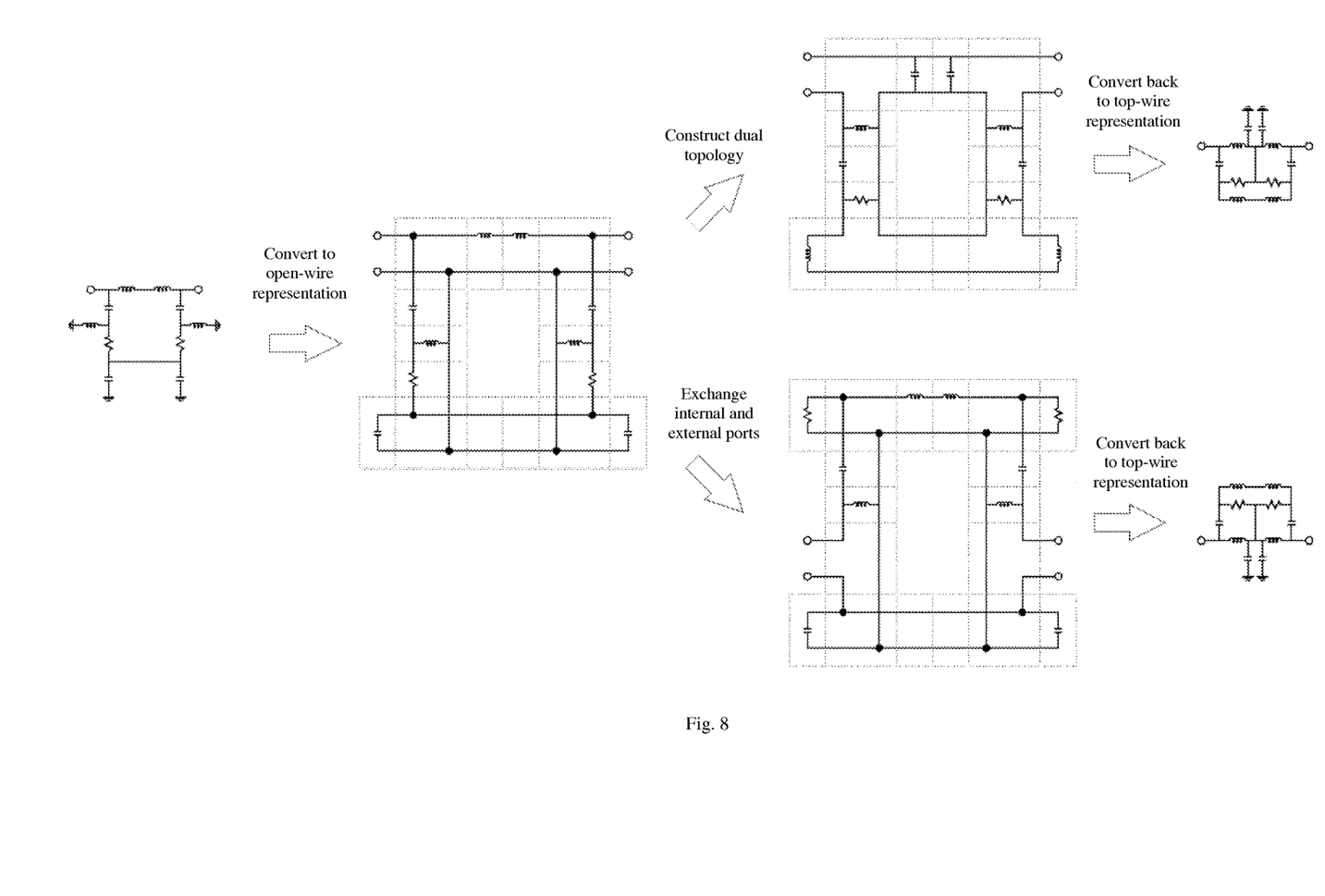
FIG. 8 is an illustration of methods for a constructing a dual reflectionless filter.
Figure 9A:
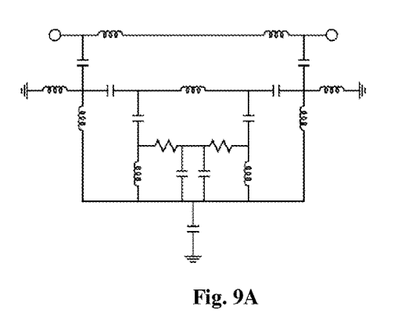
FIGS. 9A-B show two examples of a third-order reflectionless filter constructed with nested duals. Both circuits shown have the same performance as that in FIG. 6, but with fewer elements.
Figure 9B:
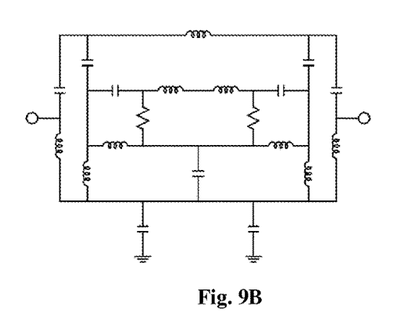
Figure 10:
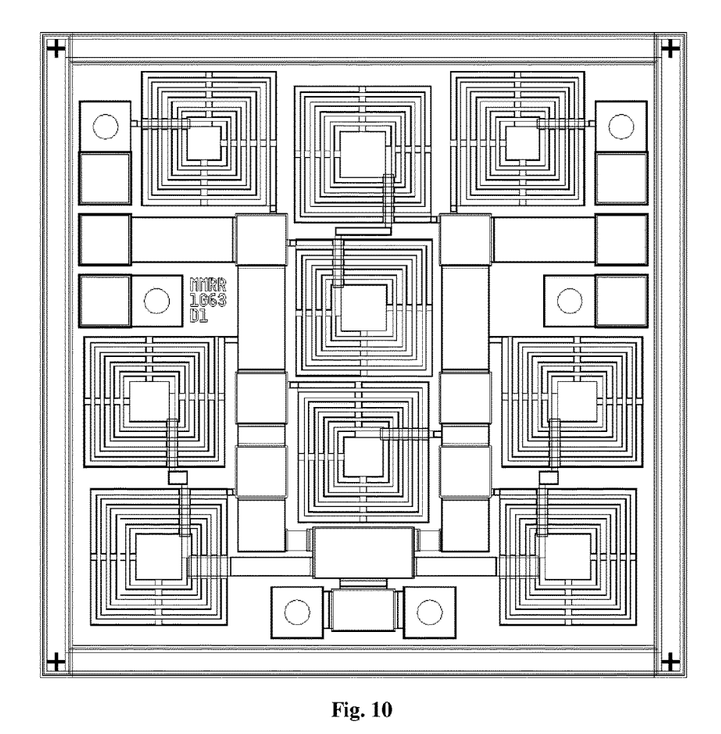
FIG. 10 is an example MMIC layout out of the third-order filter shown in FIG. 9A.

In another preferred embodiment, the sub-network of a reflectionless filter is its own dual reflectionless filter. An example is shown in FIGS. 9A and 9B, wherein third-order low-pass reflectionless filters are constructed by nesting the canonical first-order filter in FIG. 1 with it's dual shown in FIG. 8, again with the original reflectionless filter, or vice-versa. Subsequent parallel and series connections of identical elements have resulted in a reduction in the number of elements compared to the third-order filter in FIG. 6, but they have same frequency response, shown in FIG. 7. The reduced number of elements facilitates their implementation in some technologies, such as the MMIC layout shown in FIG. 10.

Figure 11:
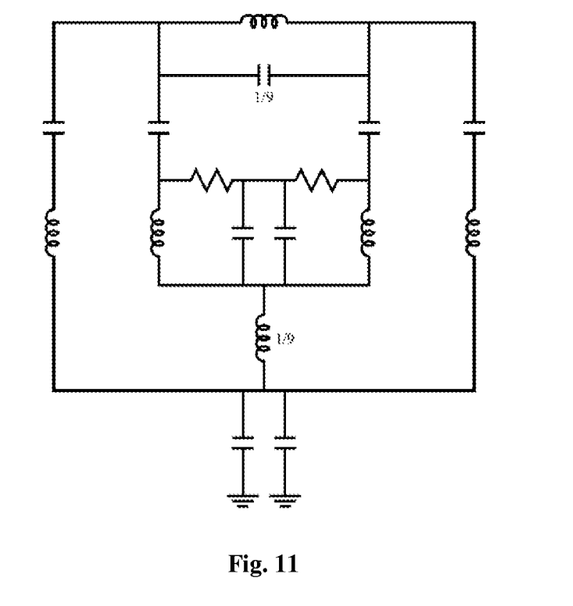
FIG. 11 is an example of an example of a second-order reflectionless filter constructed by nesting dual filters, wherein the filter has been modified with an additional inductor and capacitor.
Figure 12:
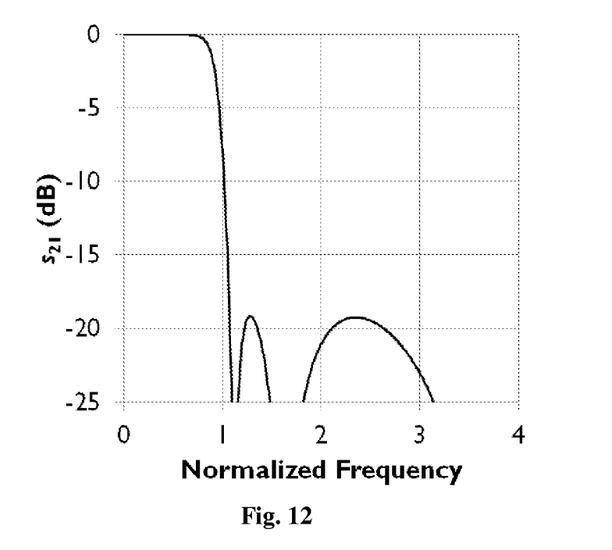
FIG. 12 is the simulated performance of the reflectionless filter in FIG. 11.
Figure 13:
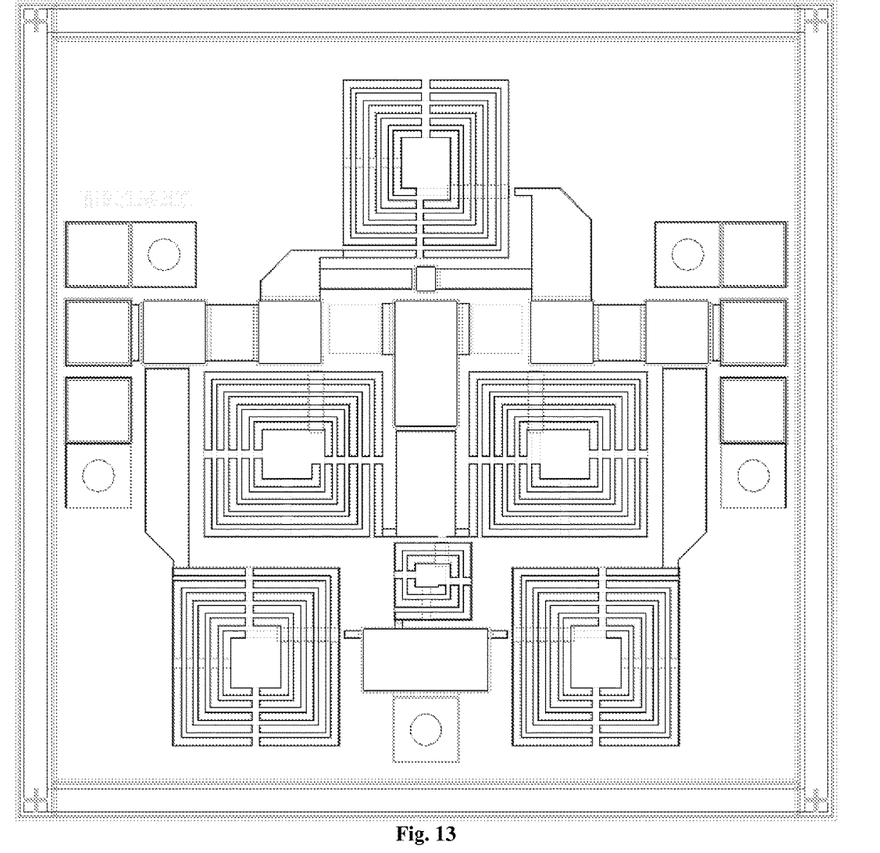
FIG. 13 is an example MMIC layout of the second-order reflectionless filter of FIG. 11.
Figure 14:
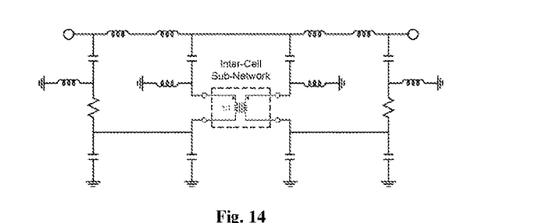
FIG. 14 is an example of a cascade of reflectionless filter cells with an inter-cell sub-network cross-connecting them.
Figure 15:
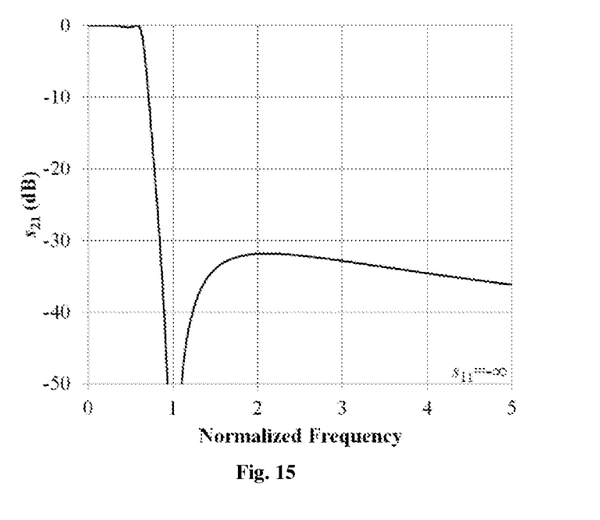
FIG. 15 is the simulated performance of a two-cell cascade with a 1:1 transformer as the inter-cell sub-network.

In another preferred embodiment, one or more of the reflectionless filters in a nested structure is modified with additional elements that preserve the symmetry and allow the duality constraints to be met. (The "duality constraints" in this context refers to the substantial equivalence of the normalized even- and odd-mode equivalent circuit impedance and admittance, respectively.) An example is shown in FIG. 11, wherein a second-order reflectionless filter is constructed by nesting two reflectionless filters, one which has been modified with an additional inductor and capacitor, and the other its (unmodified) dual. The inductor and capacitor are preferably one-ninth the size of the rest of the elements in the structure. The simulated response of this structure is shown in FIG. 12, and a MMIC layout for the same structure is shown in FIG. 13.

In another preferred embodiment, the reflectionless filter is cascaded with one or more additional reflectionless filters. The sub-network ports of the individual reflectionless filters in cascade may be connected to one another with inter-cell sub-networks. Each inter-cell sub-network may comprise one or more of an attenuator, a thru-connection, a delay line, and reflectionless filter. The inter-cell sub-networks may preferably comprise a transformer, as illustrated in FIG. 8. This inter-cell sub-network may introduce a loop in the stop-band signal path that preferably modifies the frequency response, while preferably maintaining the reflectionless property of the cascade. The frequency response of this embodiment preferably has a very sharp cutoff and good stop-band rejection over broad bandwidth, as shown in FIG. 9.

Embodiments of this invention may be implemented in many different technologies, including but not limited to Monolithic Microwave Integrated Circuits, thin-film printed circuits, thick-film printed circuits, Low-Temperature Co-fired Ceramics, and other types of integrated circuits. The essentially lossless elements may be inductors, capacitors, transmission lines, or waveguides, and they may be leaded, connectorized, or surface mount. The sub-network need not be of the same type or technology as the parent filter.

While the embodiments are shown using resistors, capacitors and inductors, any lossless elements or lossy elements can be used. Generally, the filters can just contain "lossy elements" (one possible example of which is resistors) and "lossless elements" (which can be inductors, capacitors, resonators, varactors, and/or transmission lines). Additionally certain elements of the filters can be tunable elements, diodes, and/or tunnel junctions. While the embodiments shown include elements in a certain order, the elements can be in any order. Furthermore, two or more of the same element or two or more different elements can be connected together either in series or in parallel in certain embodiments. Lumped elements, transmission-line equivalents or approximants of lumped elements, transistor-circuit equivalents or approximants of lumped elements, or any combination thereof can be used in the filters. If transistors are used, they can be Field Effect transistors, Bipolar transistors, CMOS transistors, and/or BiCMOS transistors.

The medium used to make the elements can be any known in the art, including but not limited to: coaxial, waveguide, leaded, surface mount, and monolithically-integrated. Each circuit can be superconducting.

The filters can be used in a gain block, in a tunable filter, in a filter bank, in a multiplexer, in an upconverter, in a downconverter, in a transmitter, in a receiver, in a transceiver, or in a signal source.

Other embodiments and uses of the invention will be apparent to those skilled in the art from consideration of the specification and practice of the invention disclosed herein. All references cited herein, including all publications, U.S. and foreign patents and patent applications, are specifically and entirely incorporated by reference. It is intended that the specification and examples be considered exemplary only with the true scope and spirit of the invention indicated by the following claims. Furthermore, the term "comprising of" includes the terms "consisting of" and "consisting essentially of."

The invention claimed is:

1. A reflectionless electronic filter comprising:
a symmetric two-port circuit, wherein the symmetry defines an even-mode equivalent circuit and an odd-mode equivalent circuit when the ports are driven in-phase and 180° out-of-phase, respectively;
at least one lossless element and at least one complex impedance-matched internal sub-network arranged within the symmetric two-port circuit such that:
a normalized input impedance of the even-mode equivalent circuit is substantially equal to a normalized input admittance of the odd-mode equivalent circuit; and
a normalized input impedance of the odd-mode equivalent circuit is substantially equal to a normalized input admittance of the even-mode equivalent circuit;
wherein each complex impedance-matched internal sub-network is situated within a stop-band signal path of the reflectionless electronic filter; and
wherein each complex impedance-matched internal sub-network provides an impedance-matched termination at all frequencies to the stop-band signal path of the reflectionless electronic filter;
wherein at least one complex impedance-matched internal sub-network has frequency-dependent amplitude and phase response; and
wherein at least one complex impedance-matched internal sub-network has at least one internal node in addition to the port nodes and the nodes in series with the ports or ground nodes of the sub-network.

2. The reflectionless filter of claim 1, wherein each sub-network is either symmetric or not symmetric.

3. The reflectionless filter of claim 1, further comprising:
a leakage path that passes a portion of the stop-band signal from input to output without going through a sub-network; and
wherein each sub-network is adapted to pass the stop-band signal with an amplitude and phase that partially cancels the amplitude and phase of the portion of the stop-band signal that passes through the leakage path.

4. The reflectionless filter of claim 1, wherein each sub-network comprises one of a thru-connection, a delay line, and a reflectionless filter.

5. The reflectionless filter of claim 1, wherein a sub-network contains at least one additional sub-network.

6. The reflectionless filter of claim 1, wherein a sub-network comprises a cascade of sub-networks.

7. The reflectionless filter of claim 1, wherein each sub-network comprises one of low-pass, high-pass, band-pass, band-stop, all-pass, and all-stop filter.

8. The reflectionless filter of claim 1, wherein each sub-network is active or passive.

9. The reflectionless filter of claim 1, wherein each sub-network is tunable.

10. The reflectionless filter of claim 1, wherein the reflectionless filter is a dual of another reflectionless filter.

11. The reflectionless filter of claim 10, wherein the reflectionless filter comprises a lumped element network, and wherein the dual is obtained by replacing series connections with parallel connections, parallel connections with series connections, inductors with capacitors, and capacitors with inductors.

12. The reflectionless filter of claim 1, wherein a first sub-network comprises a reflectionless filter that contains a second sub-network, and wherein the total number of reflectionless filters nested provides the filter order.

13. The reflectionless filter or claim 12, wherein the sub-network filters are tuned to the same or a different frequency as the reflectionless filter.

14. The reflectionless filter of claim 12, wherein the reflectionless filter is a dual of its sub-network.

15. The reflectionless filter of claim 12, wherein the filter is one of second-order or third-order.

16. The reflectionless filter of claim 15, wherein the third-order filter is an anti-aliasing filter.

17. The reflectionless filter of claim 1, wherein the reflectionless filter additionally comprises auxiliary elements which preserve the symmetry as well as the substantial equality of the normalized even-mode equivalent circuit impedance and the normalized odd-mode equivalent circuit admittance.

18. The reflectionless filter of claim 17 wherein the reflectionless filter is second-order, wherein a first reflectionless filter comprises auxiliary elements, and a second reflectionless filter is both a dual and the sub-network of the first reflectionless filter.

19. The reflectionless filter of claim 18, wherein the sub-network reflectionless filter either comprises or does not comprise auxiliary elements.

20. The reflectionless filter of claim 1, wherein the filter is implemented as one of a Monolithic Microwave Integrated Circuit, a thin-film printed circuit, a thick-film printed circuit, a Low-Temperature Co-fired Ceramic (LTCC) printed circuit, and an integrated circuit.

21. The reflectionless filter of claim 1, wherein each essentially lossless element is one or more of inductors, capacitors, transmission lines, and waveguides.

22. The reflectionless filter of claim 1, wherein each sub-network is implemented using the same or a different technology as the reflectionless filter.

23. The reflectionless filter of claim 1, wherein the reflectionless filter is cascaded with one or more additional reflectionless filters.

24. The reflectionless filter of claim 23, wherein the cascaded filters are of the same or different type (low-pass, high-pass, band-pass, band-stop, all-pass, all-stop, or multi-band).

25. The reflectionless filter of claim 23, wherein the cascaded filters are tuned to the same or a different frequency.

26. The reflectionless filter of claim 23, wherein the reflectionless filter is cross-connected with another reflectionless filter in the cascade via an inter-cell sub-network.

27. The reflectionless filter of claim 26, wherein the inter-cell sub-network connects adjacent or non-adjacent filters in the cascade.

28. The reflectionless filter of claim 26, wherein the inter-cell sub-network comprises one of an attenuator, a thru-connection, a delay line, and reflectionless filter.

29. The reflectionless filter of claim 26, wherein the inter-cell sub-network comprises a 1:1 transformer.

* * * * *